(12) United States Patent
Kumagai

(10) Patent No.: US 6,188,111 B1
(45) Date of Patent: *Feb. 13, 2001

(54) DUAL GATE SEMICONDUCTOR DEVICE FOR SHORTENING CHANNEL LENGTH

(75) Inventor: Kouichi Kumagai, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/052,157

(22) Filed: Mar. 31, 1998

(30) Foreign Application Priority Data

Mar. 31, 1997 (JP) .................................... 9-079381

(51) Int. Cl.[7] .................................................. H01L 29/74
(52) U.S. Cl. .......................... 257/369; 257/260; 257/270; 257/318; 257/331; 257/369
(58) Field of Search .............................. 257/69, 204, 206, 257/350, 351, 357, 369, 59, 347, 270, 260, 318, 331

(56) References Cited

U.S. PATENT DOCUMENTS

| | | | |
|---|---|---|---|
| 4,998,152 | 3/1991 | Batey et al. . | |
| 5,557,231 | * 9/1996 | Yamaguchi et al. | 327/534 |
| 5,747,847 | * 5/1998 | Morinaka et al. | 257/315 |
| 5,818,070 | * 10/1998 | Yamazaki et al. | 257/72 |
| 5,821,137 | * 10/1998 | Wakai et al. | 438/163 |

FOREIGN PATENT DOCUMENTS

| | | |
|---|---|---|
| 55-132072 | 10/1980 | (JP) . |
| 62-149171 | 7/1987 | (JP) . |
| 3-132041 | 6/1991 | (JP) . |
| 4-10660 | 1/1992 | (JP) . |
| 5-145073 | 6/1993 | (JP) . |
| 6-275826 | 9/1994 | (JP) . |
| 7-106579 | 4/1995 | (JP) . |
| 8-32068 | 2/1996 | (JP) . |

* cited by examiner

*Primary Examiner*—Fetsum Abraham
(74) *Attorney, Agent, or Firm*—Young & Thompson

(57) ABSTRACT

In a semiconductor device including a MOSFET, a first semiconductor layer is formed over a silicon substrate and has a gate region. Further, a second semiconductor layer is formed over the first semiconductor layer with a gate oxide film therebetween, and has an active region. The active region has a source region, a drain region and a channel region. An insulator layer on the active region encloses a back gate wiring layer.

3 Claims, 11 Drawing Sheets

DUAL GATE SEMICONDUCTOR DEVICE FOR SHORTENING CHANNEL LENGTH

BACKGROUND OF THE INVENTION

This invention relates to a semiconductor device, and in particular, to a MOSFET which is formed over a SOI (Silicon On Insulator) substrate.

Conventionally, a MOS transistor is often formed on an insulator as a thin-film semiconductor device by the use of the known SOI substrate.

Specifically, an oxide film (namely, an insulator) is embedded in a silicon substrate. Further, an active region (a silicon layer) is formed on the oxide film. In this event, a source diffusion layer, a drain diffusion layer and a channel region are formed in the active region, respectively. Moreover, a gate region is formed over the channel region via a gate oxide film. Herein, the gate region is formed by a polysilicon. In addition, side walls are formed at both side surfaces of the gate region.

In this case, the source and drain diffusion layers are formed by implanting or doping impurity ions after patterning the gate region and forming the side walls. Herein, the ion implantation is carried out by using the gate region and the side walls as a mask in the known self-alignment manner. Consequently, the channel length which determines the performance of the MOS transistor is determined by fine process accuracy of the gate region and the side walls.

In this event, the gate region is generally formed by the following processes.

(1) Growth of a gate electrode (polysilicon)
(2) Application of a photoresist
(3) Patterning of the photoresist
(4) Etching of the gate electrode The gate length is mainly determined by (3) the patterning of the photoresist and (4) the etching of the gate electrode.

Recently, the semiconductor device having the gate length of 0.35 μm level is practically used. However, as the gate length is further shortened, it becomes difficult to keep the process accuracy in the conventional MOS transistor.

On the other hand, a CMOS circuit is often structured as an inverter by the MOS transistors (an N-channel MOS transistor and a P-channel MOS transistor). Further, a latch circuit is constituted by connecting a plurality of CMOS circuits. In this case, the diffusion layer in the active region is connected to the gate region by the use of a wiring layer. Consequently, the layout area of the circuit is increased to reduce integration degree of the device because the wiring layer is additionally required to connect between the diffusion layer and the gate region.

SUMMARY OF THE INVENTION

It is therefore an object of this invention to provide a semiconductor device which is capable of shortening a channel length of a MOS transistor.

It is another object of this invention to provide a semiconductor device which is capable of reducing a layout area to increase integration degree in a logic circuit.

According to a semiconductor device including a MOS transistor, a first semiconductor layer is formed over a silicon substrate and has a gate region. Further, a second semiconductor layer is formed over the first semiconductor layer via a gate oxide film and has an active region. Herein, the active region has a source region, a drain region and a channel region. The channel region is placed between the source region and the drain region and over the gate region.

By adopting the above structure, the number of the manufacturing steps which give a large influence to determine the channel length is reduced as compared to the conventional semiconductor device. Consequently, the channel length can be further reduced.

Further, a wiring layer (namely, a back gate) is formed over the channel region so as to control potential of the channel region. The back gate can be easily formed by the use of the metal wiring layer which is formed by the normal process. The circuit characteristic can be controlled by controlling the potential of the back gate.

Moreover, according to a semiconductor device constituting a latch circuit, the latch circuit has a first CMOS circuit and a second CMOS circuit. The first CMOS circuit includes a first semiconductor layer which is formed over a silicon substrate and a second semiconductor layer which is formed over said first semiconductor layer. In this event, the first semiconductor layer has a first active region while the second semiconductor layer has a first gate region.

On the other hand, the second CMOS circuit includes a third semiconductor layer which is formed over the silicon substrate and a fourth semiconductor layer which is formed over the third semiconductor layer. In this event, the third semiconductor layer has a second gate region while the fourth semiconductor layer has a second active region.

In this event, the first semiconductor layer is directly coupled to or integrated with the third semiconductor layer. Specifically, each of the first and third semiconductor layers is formed by the silicon layer while each of the second and fourth semiconductor layers is formed by the polysilicon layer. With such a structure, the metal wiring area in the circuit block can be reduced to increase the integration degree of the device.

DESCRIPTION OF THE PREFERRED EMBODIMENTS

Figure 1:
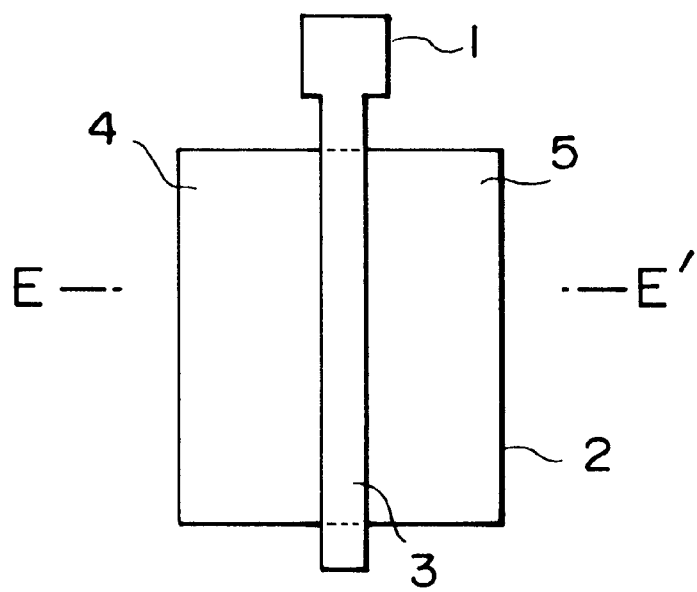
FIG. 1 is a plan view showing a layout of the conventional N-channel MOSFET.

Referring to FIG. 1, a conventional semiconductor device will be first described for a better understanding of this invention. The semiconductor device is equivalent to the conventional semiconductor device mentioned in the preamble of the instant specification.

As illustrated in FIG. 1, the conventional N-channel MOSFET has a gate region 1 of a polysilicon layer and an active region 2 of a silicon layer. A p-channel region 3, an n⁺ source diffusion layer 4 and an n⁺ drain diffusion layer 5 are formed in the active layer 2.

Figure 2:
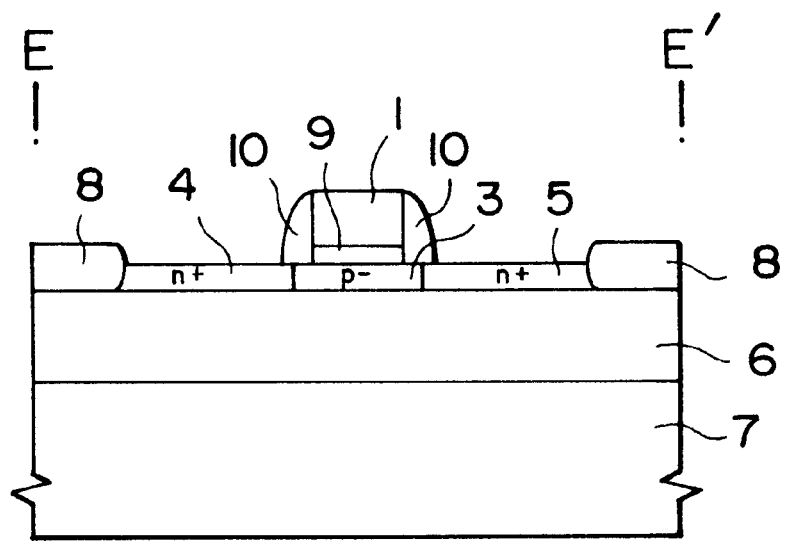
FIG. 2 is a cross sectional view showing the conventional N-channel MOSFET illustrated in FIG. 1, taken along E-E' line.

As shown in FIG. 2, an oxide film or layer 6 is embedded in a silicon substrate 7. The above N-channel MOSFET illustrated in FIG. 1 is formed on the oxide film 7. Herein, it is to be noted that the oxide film 6 and the silicon substrate 7 may be hereinafter called as a SOI substrate while the MOSFET on the oxide film 6 and over the silicon substrate may be hereinafter referred to as a SOI MOSFET. Thus, the N-channel MOSFET is formed on the SOI substrate. Specifically, the active region 2 having the channel region 3, the source diffusion layer 4 and the drain diffusion layer 5 is formed on the oxide film 6. Further, oxide layers 8 are formed at both sides of the active region 2 on the oxide film 6. The active region 2 is electrically separated from the other active region (not shown) by the oxide layers 8 and the oxide film 6. Herein, the oxide layer 8 may be hereinafter called a LOCOS (Local Oxidation of Silicon) layer. Further, the gate region 1 is formed over the channel region 5 via a gate oxide film 9. Moreover, side walls 10 are formed at both side surfaces of the gate region 1.

In this event, the source diffusion layer 4 and the drain diffusion layer 5 are formed by implanting or doping impurity ions after patterning the gate region 1 and forming the side walls 10. The ion implantation is carried out by using the gate region 1 and the side walls 10 as a mask in the known self-alignment manner. Consequently, a channel length (L) which determines performance of the MOS transistor (MOSFET) is almost determined by fine process accuracy of the gate region 1 and the side walls 10.

Herein, the gate region 1 is generally formed via the following steps.

(1) Growth of a gate electrode (polysilicon)

(2) Application of a photoresist (3) Patterning of the photoresist (4) Etching of the gate electrode Among the above-mentioned steps, a gate length is mainly determined by (3) the patterning of the photoresist and (4) the etching of the gate electrode.

Recently, the device having the gate length of 0.35 μm level has been practically used. However, as the gate length is shortened, it becomes difficult to keep the process accuracy. This problem relates to not only the SOI MOSFET but also the bulk MOSFET.

Figure 3:
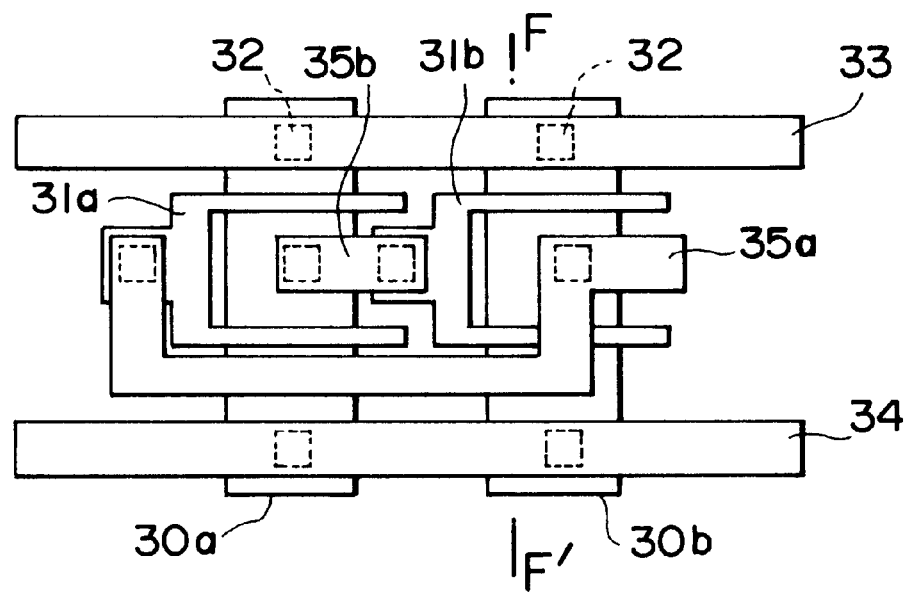
FIG. 3 is a plan view showing a layout of a latch circuit which is structured by the conventional CMOS circuits.

A latch circuit illustrated in FIG. 3 has active regions 30 and 30b, gate regions 31a and 31b, contact regions 32, a power supply wiring layer 33 and a ground wiring layer 34. In this event, the gate region 31a is connected to the active region 30b via a signal wiring layer 35a while the gate region 31b is connected to the active region 30a via a signal wiring layer 35b. Herein, the power supply wiring layer 33 and the ground wiring layer 34 correspond to a power supply 133 and a ground 134 in FIG. 13, respectively. Further, the signal wiring layers 35a and 35b correspond to signal wiring layers which are connected to signal terminals 135 and 136 in FIG. 13.

Figure 4:
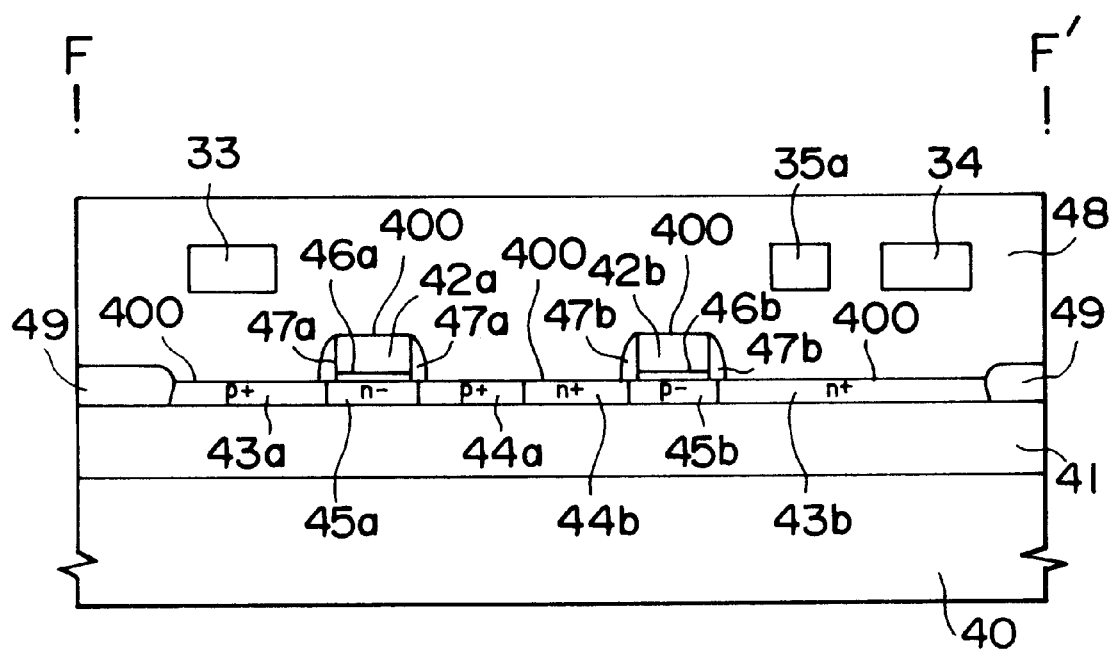
FIG. 4 is a cross sectional view showing the conventional CMOS circuit illustrated in FIG. 3, taken along F-F' line.
Figure 13:
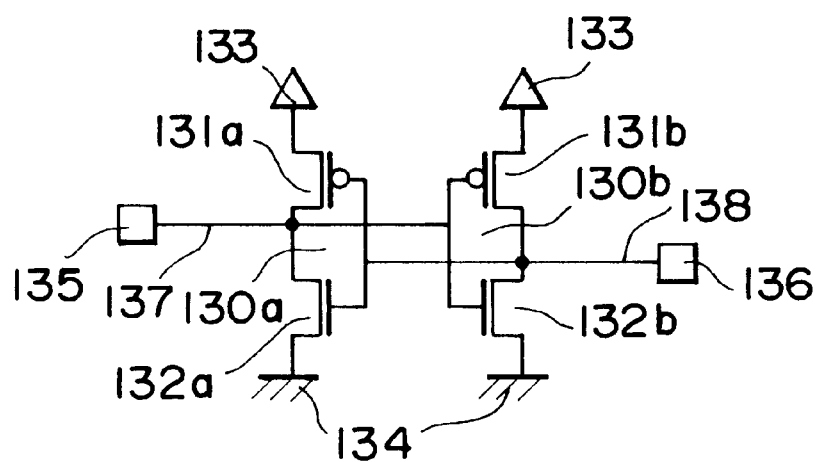
FIG. 13 is an equivalent circuit of the latch circuit illustrated in FIG. 12

In FIG. 4, an oxide film 41 is embedded in a silicon substrate 40. The P-channel MOSFET and the N-channel MOSFET which constitutes the inverter circuit 130b in FIG. 13 are formed on the oxide film 41. The P-channel MOSFET is composed of a gate region 42a, a p⁺ source diffusion layer 43a and a p⁺ drain diffusion layer 44a and an n-channel region 45a while the N-channel MOSFET is composed of a gate region 42b, an n⁺ source diffusion layer 43b and an n⁺ drain diffusion layer 44b and a p-channel region 45b. The gate region 42a is formed over the channel region 45a via an gate oxide film 46a. Side walls 47a are formed at both side faces of the gate region 42a. On the other hand, the gate region 42b is formed over the channel region 45b via an gate oxide film 46b. Side walls 47b are formed at both side surfaces of the gate region 42b.

Further, the P-channel MOSFET and the N-channel MOSFET are covered with an insulating film 48. The power supply wiring layer 33, the ground wiring layer 34 and the signal wiring layer 35a in FIG. 3 are arranged in the insulating film 48. The P-channel MOSFET and the N-channel MOSFET are separated from the other MOSFETs via an oxide layer 49 (namely, a LOCOS layer).

With such a structure, a power supply potential is given to the p⁺ source diffusion layer 43a from the power supply wiring layer 33 via the contact 32. Further, a ground potential is given to the n⁺ source diffusion layer 43b from the ground wiring layer 34 via the contact 32.

Moreover, a silicide layer 400 is formed on the gate regions 42a and 42b and the diffusion layers 43a, 43b, 44a and 44b to reduce sheet resistance. In this event, the p⁺ drain diffusion layer 44a and the n⁺ drain diffusion layer 44b is connected by the silicide layer 400. Thus, the inverter 130b which is composed of the P-channel MOSFET and the N-channel MOSFET in FIG. 13 is structured.

The other inverter 130a which is composed of the P-channel MOSFET and the N-channel MOSFET in FIG. 13 is also structured by the active region 30a and the gate region 31a in FIG. 3 in the same manner. In FIG. 3, signal wiring layers 35a and 35b correspond to signal lines which are connected to signal terminals 135 and 136 in FIG. 13, respectively. Thus, the latch circuit in FIG. 13 is structured by a layout illustrated in FIG. 3.

When the latch circuit is structured by the conventional SOI MOSFET as illustrated in FIG. 3, a layout area of the circuit is increased to reduce a integration degree of the device because the signal wiring layers 35a and 35b are additionally required. This problem relates to not only the SOI MOSFET but also the bulk MOSFET.

Figure 5:
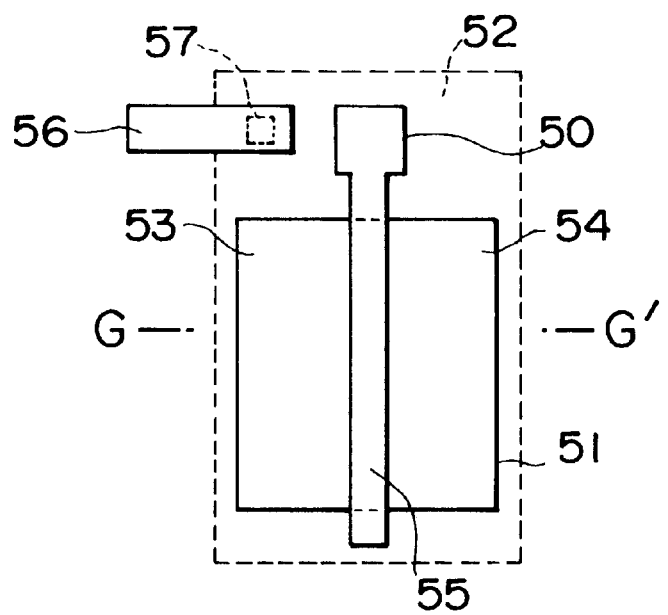
FIG. 5 is a plan view showing the conventional N-channel MOSFET having a back gate.
Figure 6:
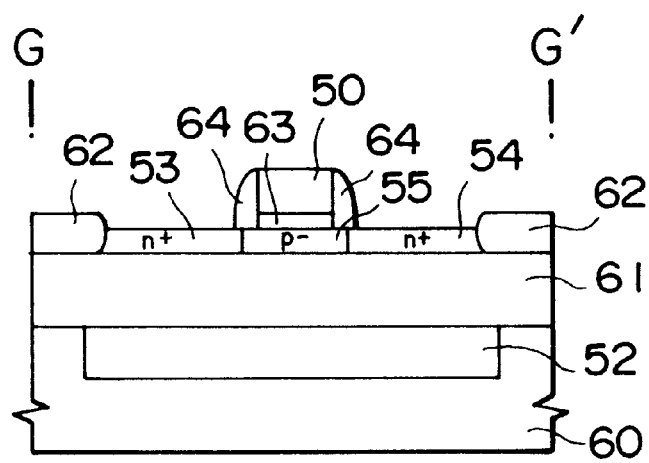
FIG. 6 is a cross sectional view showing the conventional N-channel MOSFET illustrated in FIG. 5, taken along G-G' line.

Moreover, a structure illustrated in FIGS. 5 and 6 has been known as the conventional SOI MOSFET and is disclosed in Japanese Unexamined Patent Publication No. Hei. 7-106579. The above structure has a gate region 50, an active region 51 and an N-well 52. In this case, the gate region 50 is formed by a polysilicon layer while the active region is formed by a silicon layer. Herein, an n⁺ source diffusion layer 53, an n⁺ drain diffusion layer 54 and a p-channel region 55 are formed in the active region 51.

Further, the N-well 52 is connected to a wiring layer 56 via a well contact 57.

More specifically, the N-well is formed in a P-type silicon substrate 60 as shown in FIG. 6. In this event, the N-well is formed by highly doping impurity ions. Further, an oxide film 61 is embedded in the silicon substrate 60. The $n^+$ source diffusion layer 53, the $n^+$ drain diffusion layer 54 and the p-channel region 55 are formed on the oxide film 61. Moreover, oxide layers (namely, LOCOS layers) are formed at both sides of the active region 51 on the oxide film 61 to separate the active region 51 from the other active region (not shown). The gate region 50 is formed over the p-channel region 55 via a gate oxide film 63. Further, side walls 64 are formed at both side surfaces of the gate region. 50.

With such a structure, a potential is given to the N-well 52 from the wiring layer 56 via the well contact 57. The above N-well 52 is generally called a back gate. The threshold voltage of the MOSFET is controlled by the potential of N-well (the back gate) 52. Thereby, the MOSFET can operate at a high speed with reduction of a leak current.

However, when the above-mentioned structure in FIG. 6 is manufactured, the process for manufacturing the N-well 52 and the well contact 57 is required in addition to the normal process of the SOI MOSFET. Further, a parasitic capacitance is formed between the source diffusion layer 53 or the drain diffusion layer 54 and the N-well 52 in the structure illustrated in FIGS. 5 and 6. Consequently, the operation speed of the circuit is deteriorated.

As mentioned above, the gate length is determined by the process accuracy of the gate region (namely, gate electrode) in the conventional MOSFET in FIG. 2. This is because the impurity ion implantation for forming the source diffusion layer 4 and the drain diffusion layer 5 is carried out by using the gate region 1 and the side walls 10 as the mask in the self-alignment manner.

Further, the layout area of the circuit in FIG. 3 is increased to reduce the integration degree of the device when the latch circuit is structured by the conventional MOSFET in FIG. 4. This is because the active regions 30a and 30b are connected to the gate regions 31a and 31b by the use of the metal wiring layers 35a 35b as illustrated in FIG. 3.

Moreover, the manufacturing process is increased in the conventional SOI MOSFET having the N-well 52 (back gate) as illustrated in FIGS. 5 and 6. This is because a step for forming the back gate 52 below the oxide film 61 and a step for forming the well contact 57 for connecting the back gate 52 are required in addition to the normal manufacturing process of the SOI MOSFET.

Taking the above-mentioned problems into consideration, this invention provides a semiconductor device which is capable of shortening a channel length of a MOSFET and reducing a layout area to increase integration degree of a logic circuit.

First Embodiment

Figure 7:
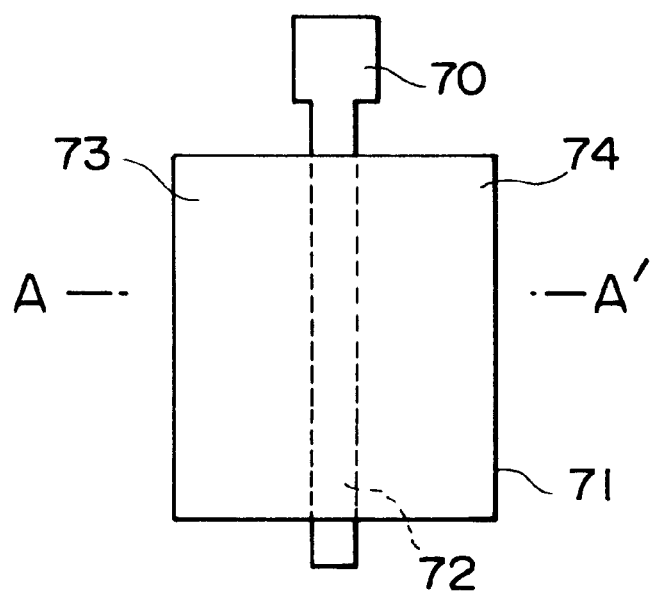
FIG. 7 is a plan view showing an N-channel MOSFET according to a first embodiment of this invention.

As illustrated in FIG. 7, an N-channel MOSFET has a gate region 70 of a silicon layer, an active region 71 of a polysilicon. In this event, a channel region 72 and an $n^+$ source diffusion layer 73 and an $n^+$ drain diffusion layer 74 are formed in the active region 71.

Figure 8:
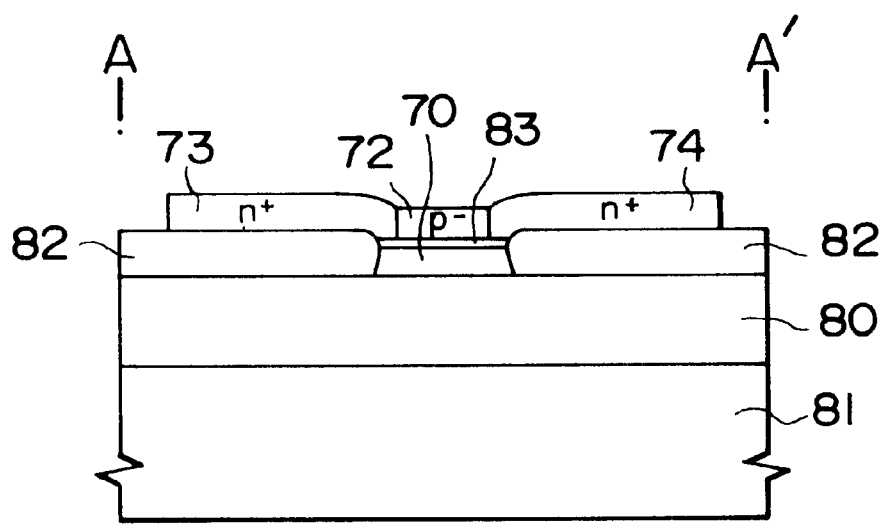
FIG. 8 is a cross sectional view showing the N-channel MOSFET illustrated in FIG. 7, taken along A-A' line.

As shown in FIG. 8, an oxide film 80 is embedded in a silicon substrate 81. The N-channel MOSFET illustrated in FIG. 7 is formed on the oxide film 80 over the silicon substrate 81. Specifically, the gate region 70 is formed on the oxide film 80. In this event, oxide layers 82 (namely, LOCOS layers) are formed at both sides of the gate region 70 on the oxide film 80 for electrical separation. Further, the active region 71 is formed over the gate region 70 a gate oxide film 83 therebetween. In this event, the channel region 72 is formed over the gate region 70. The channel region 72 is placed between the $n^+$ source diffusion layer 73 and the $n^+$ drain diffusion layer 74.

In this case, each of the $n^+$ source diffusion layer 73 and the $n^+$ drain diffusion layer 74 is formed by doping impurity ions by using a photoresist as a mask after patterning the active region 71. Therefore, the channel length is mainly determined by only the step for patterning the above photoresist in the SOI MOSFET according to the first embodiment.

In contrast, the channel length is determined by (1) the patterning of the photoresist with respect to the gate electrode, (2) the etching of the gate electrode, and (3) the formation of the side walls in the conventional SOI MOSFET illustrated in FIGS. 1 and 2.

Consequently, the channel length of the MOSFET according to the first embodiment can be further shortened as compared to the conventional one because the manufacturing steps which give a large influence for determining the channel length is reduced. Thereafter, as the gate length is shortened, the advantage of the first embodiment will be increased.

Second Embodiment

Figure 10:
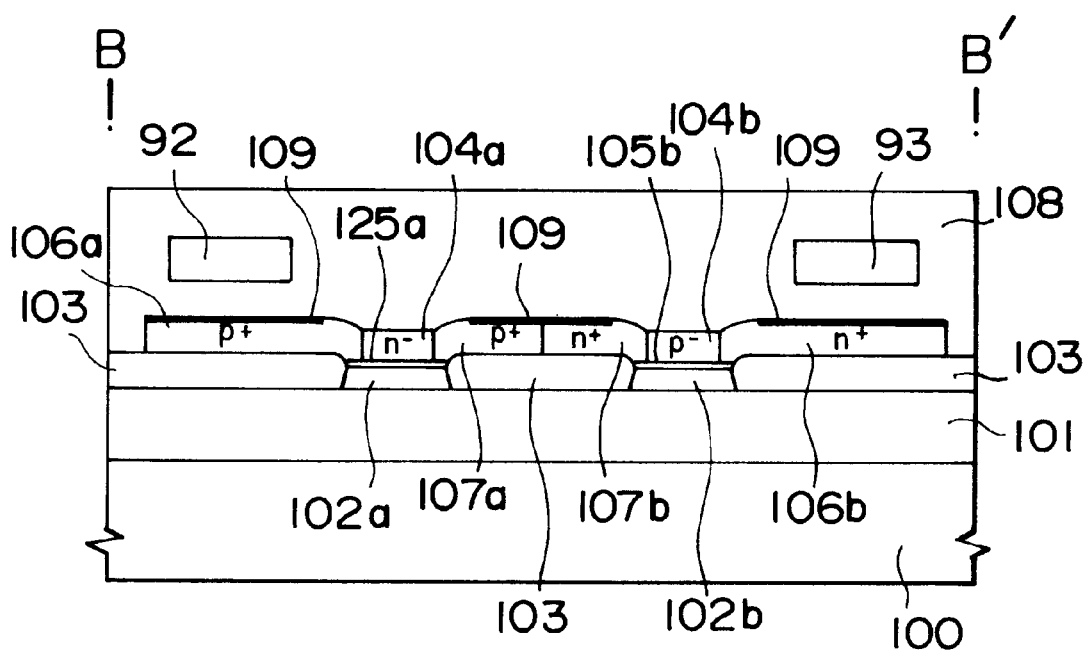
FIG. 10 is a cross sectional view showing the delay circuit illustrated in FIG. 9, taken along B-B' line.
Figure 11:
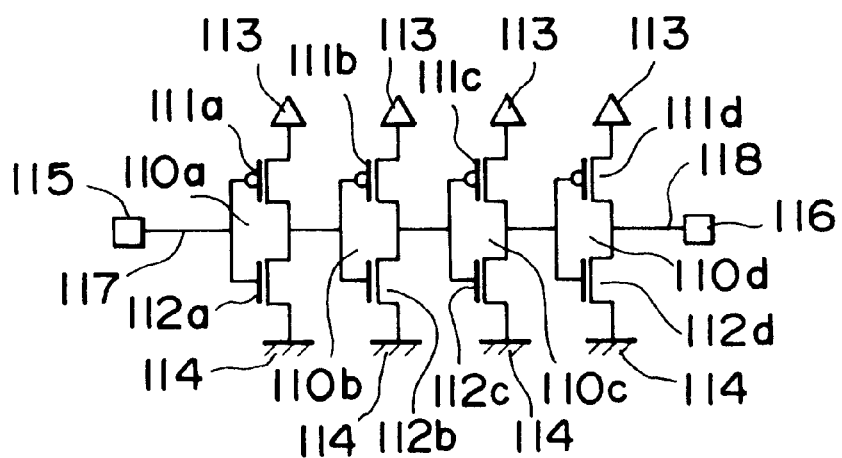
FIG. 11 is an equivalent circuit of the delay circuit illustrated in FIG. 9.

A delay circuit illustrated in FIG. 11 is structured by connecting a first inverter 100a, a second inverter 100b, a third inverter 100c and a fourth inverter 110d in series. The first inverter 110a is composed of a P-channel MOSFET 111a and an N-channel MOSFET 112a while the second inverter 110b is composed of a P-channel MOSFET 111b and an N-channel MOSFET 112b. Further, the third inverter 110c is composed of a P-channel MOSFET 111c and an N-channel MOSFET 112c while the fourth inverter 110d is composed of a P-channel MOSFET 111d and an N-channel MOSFET 112d. In this event, the P-channel MOSFETs 111a through 111d are connected to a power supply 113 while the N-channel MOSFETs 112a through 112d are connected a ground 114. Further, the first inverter 110a is connected to an input terminal 115 via a signal line 117 while the fourth inverter 110d is connected to an output terminal 116 via a signal line 118. Herein, it is to be noted that each of the first and third inverters 110a and 110c corresponds to the conventional inverter illustrated in FIG. 4 while each of the second and fourth inverters 110b and 110d corresponds to the inverter illustrated in FIG. 10 according to the second embodiment.

Figure 9:
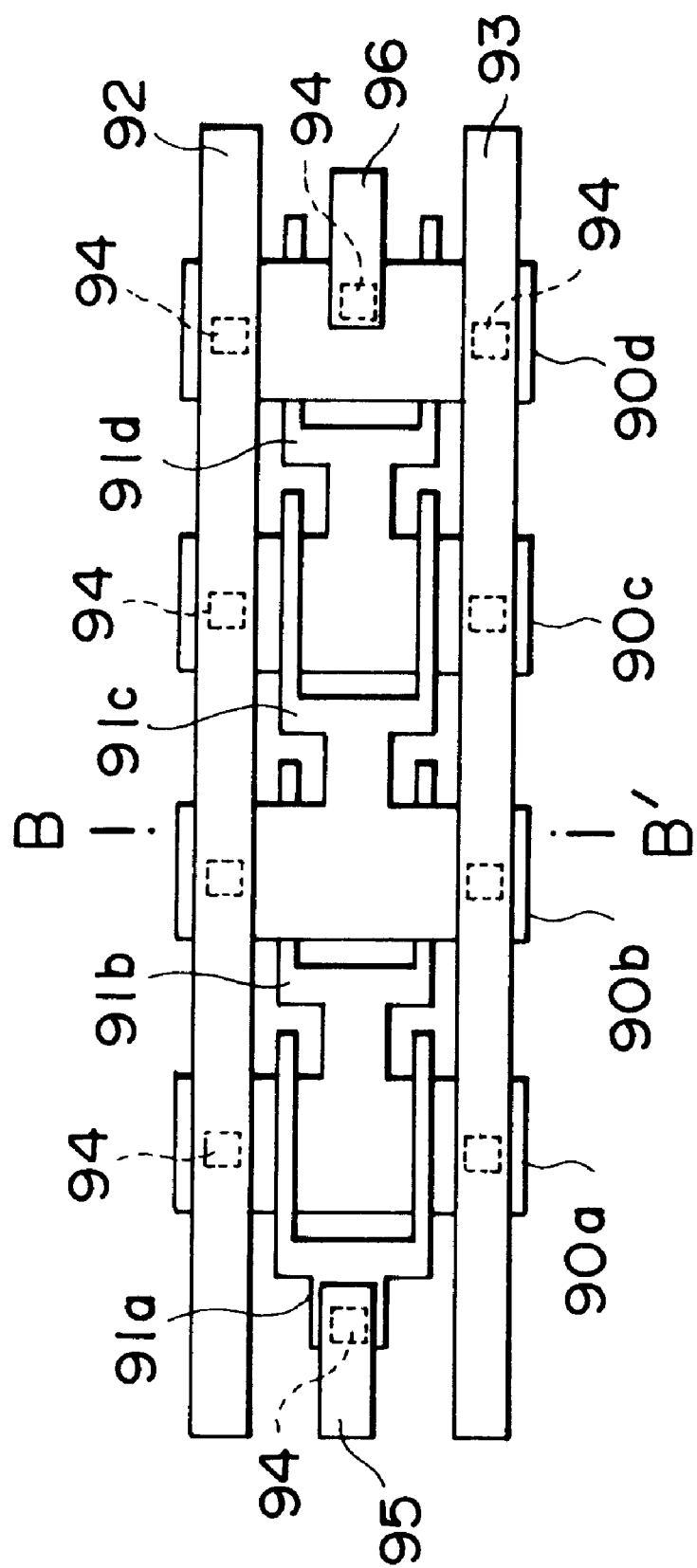
FIG. 9 is a plan view showing a layout of a delay circuit according to a second embodiment of this invention.

A layout of the delay circuit in FIG. 11 is shown in FIG. 9.

In this layout, gate region 91a and 91c are formed over active regions 90a and 90c while active regions 90b and 90d are formed over gate region 91b and 91d. A power supply wiring layer 92 and a ground wiring layer 93 are formed over the active regions 90a, 90b, 90c and 90d via contacts 94. Further, the gate region 91a is connected to a signal wiring layer 95 via the contact 94 while the active region 90d is connected to a signal wiring layer 96 via the contact 96. Herein, each of the active regions 90a and 90c is formed by a silicon layer while each of the gate regions 91a and 91c is formed by a polysilicon layer as illustrated in FIG. 4. On the other hand, each of the active regions 90b and 90d is formed by the polysilicon layer while each of the gate regions 91b and 91d is formed by the silicon layer as illustrated in FIG. 10. In this event, the power supply wiring layer 92 and the ground wiring layer correspond to the power supply 113 and the ground 114 in FIG. 11, respectively, while the signal wiring layers 95 and 96 correspond to the signal lines 117 and 118 in FIG. 11.

In FIG. 10, the P-channel MOSFET 111b and the N-channel MOSFET 112b which constitutes the inverter 110b in FIG. 11 are formed over a silicon substrate 100. An oxide film 101 is embedded in the silicon substrate 100. Gate regions 102a and 102b are formed on the oxide film 101. In this event, the gate regions 102a and 102b correspond to the gate region 91b in FIG. 9. Further, oxide layers 103 (namely, LOCOS layers) are formed on the oxide film 101 for electrical separation. An n-channel region 104a is formed over the gate region 102a, with a gate oxide film 105a therebetween. A p⁺ source diffusion layer 106a and a p⁺ drain diffusion layer are 107a are placed at both sides of the n-channel region 104a. In this case, the p⁺ source diffusion layer 106a, p⁺ source diffusion layer 107a and the n-channel region 104a are formed in the active region 90b illustrated in FIG. 9. As mentioned before, the gate region 102a is formed by the silicon layer while each of the p⁺ source diffusion layer 106a, p⁺ drain diffusion layer 107a and the n-channel region 104a is formed by the polysilicon layer. Thus, the P-channel MOSFET 111b illustrated in FIG. 11 is structured.

On the other hand, a p-channel region 104b is formed over the gate region 102b via a gate oxide film 105b. An n⁺ source diffusion layer 106b and n⁺ drain diffusion layer 107b are placed at both sides of the p-channel region 104b. In this case, the n⁺ source diffusion layer 106b, n⁺ drain diffusion layer 107b and the n-channel region 104b are formed in the active region 90b illustrated in FIG. 9. As mentioned before, the gate region 102b is formed by the silicon layer while each of the n⁺ source diffusion layer 106b, n⁺ drain diffusion layer 107b and the p-channel region 104b is formed by the polysilicon layer. Thus, the N-channel MOSFET 112b illustrated in FIG. 11 is structured.

Moreover, the P-channel MOSFET and the N-channel MOSFETs are covered with an insulating film 108. In this event, the power supply wiring layer 92 and the ground wiring layer 93 in FIG. 9 are arranged in the insulating film 108.

With such a structure, a power supply potential is given to the p⁺ source diffusion layer 106a of the P-channel MOSFET 111b from the power supply wiring layer 92 via the contact 94. Further, a ground potential is given to the n⁺ source diffusion layer 106b of the N-channel MOSFET 112 from the ground wiring layer 93 via the contact 94. Moreover, silicide layers 109 are formed on the diffusion layers 106 and 107 to reduce sheet resistance. Further, the p⁺ drain diffusion layer 107a of the P-channel MOSFET 11b is connected to the n⁺ drain diffusion layer 107b of the N-channel MOSFET 112b by the silicide layer 109.

The inverter 110b in FIG.11 is constituted by the above-mentioned manner. The other inverter 110d in FIG. 11 is also made in the same manner with the inverter 110b as illustrated in FIG. 10. In contrast, the inverters 110a and 110c is made in the conventional manner as illustrated in FIG. 4.

As shown in FIG. 9, the drain diffusion layers (output terminal) in the active region 90a of the first inverter 110a is directly coupled to or integrated with the gate region 91b (input terminal) of the second inverter 110b. In this event, the active region 90a and the gate region 91b are formed the same the silicon layer.

Further, the drain diffusion layers (output terminal) in the active region 90b of the second inverter 110b is directly coupled to or integrated with the gate region 91c (input terminal) of the third inverter 110c. In this event, the active region 90b and the gate region 91c are formed the same the polysilicon layer.

Moreover, the drain diffusion layers (output terminal) in the active region 90c of the third inverter 110c is directly coupled or integrated with the gate region 91d (input terminal) of the fourth inverter 110d. In this event, the active region 90c and the gate region 91d are formed the same the silicon layer.

In this case, no metal wiring layers are used to connect the drain diffusion layers with the gate regions 91. Consequently, the wiring area is reduced in the logic block to increase the integration degree of the device.

According to the second embodiment, the SOI MOSFET of this invention and the conventional SOI MOSFET are arranged on the same SOI substrate as illustrated in FIG. 9. Consequently, the diffusion layer (output terminal) of the CMOS logic block can be connected to the gate region (input terminal) of the next stage of CMOS logic block without the metal wiring layer. Thereby, the metal wiring area in the logic block is reduced to increase the integration degree of the device, as mentioned before.

Third Embodiment

A latch circuit illustrated in FIG. 13 is structured by connecting a first inverters 130a and a second inverter 130b in series. The first inverter 1130a is composed of a P-channel MOSFET 131a and an N-channel MOSFET 132a while the second inverter 130b is composed of a P-channel MOSFET 131b and an N-channel MOSFET 132b. In this event, the P-channel MOSFETs 131a and 131b are connected to a power supply 133 while the N-channel MOSFETs 132a and 132b are connected a ground 134. Further, the first inverter 130a is connected to an input terminal 135 via a signal line 137 while the second inverter 130d is connected to an output terminal 136 via a signal line 138.

Herein, it is to be noted that the first inverter 130a corresponds to the conventional inverter illustrated in FIG. 4 while the second inverter 130b correspond to the inverter illustrated in FIG. 10 in the third embodiment. With respect to this point, the latch circuit in FIG. 12 is entirely different from the conventional latch circuit in FIG.3.

Figure 12:
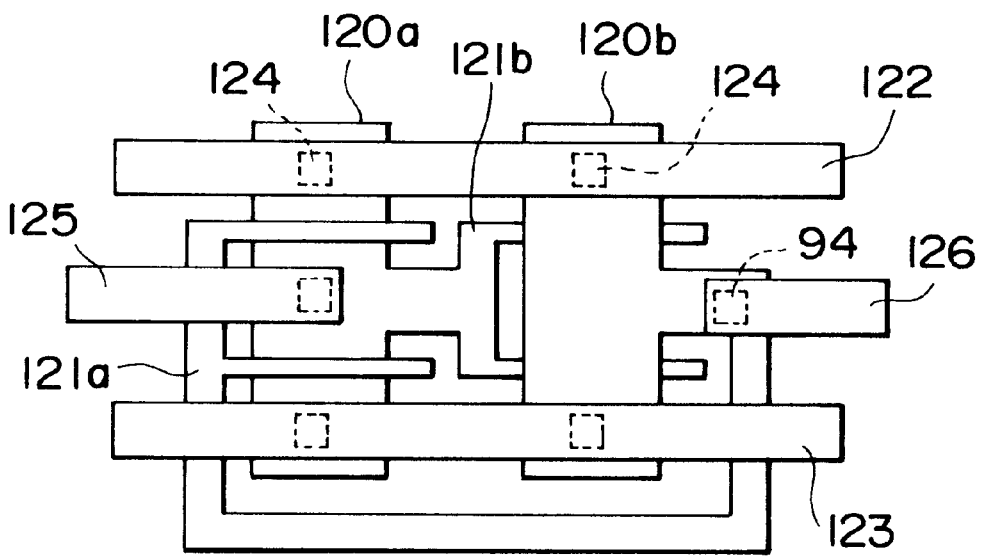
FIG. 12 is a plan view showing a layout of a latch circuit according to a third embodiment of this invention.

A layout of the latch circuit in FIG. 13 is shown in FIG. 12.

In this layout, a gate region 121a is formed over an active region 120a while an active region 120b is formed over a gate region 121b. A power supply wiring layer 122 and a ground wiring layer 123 are formed over the active regions 120a and 120b via contacts 124. Further, the active region 120a is connected to a signal wiring layer 125 via the contact 94 while the active region 120b is connected to a signal wiring layer 126 via the contact 94. Herein, the active regions 120a is formed by a silicon layer while the gate region 121a is formed by a polysilicon layer as illustrated in FIG. 4. On the other hand, the active region 120b is formed by the polysilicon layer while the gate region 121b is formed by the silicon layer as illustrated in FIG. 10. In this event, the power supply wiring layer 122 and the ground wiring layer 123 correspond to the power supply 133 and the ground 134 in FIG. 13, respectively, while the signal wiring layers 125 and 126 correspond to the signal lines 137 and 138 in FIG. 13.

As shown in FIG. 12, the drain diffusion layers (output terminal) in the active region 120a of the first inverter 130a is directly coupled or integrated with the gate region 121b (input terminal) of the second inverter 130b. In this event, the active region 120a and the gate region 121b are formed the same the silicon layer. On the other hand, the gate region 121a (output terminal) of the first inverter 130a is directly coupled or integrated with the drain diffusion layers (output terminal) in the active region 120b of the second inverter 130b. In this event, the active region 120b and the gate region 121a are formed by the same the polysilicon layer.

Consequently, the metal wiring area in the layout of FIG. 12 is reduced as compared to the conventional layout illustrated in FIG. 3. The latch circuit of the third embodiment often and practically is used in a block LSI because the latch circuit is a basic circuit of a data holding circuit or a sequential circuit. As a result, the integration degree can be increased by reducing the metal wiring area in the block circuit.

Forth Embodiment

Figure 14:
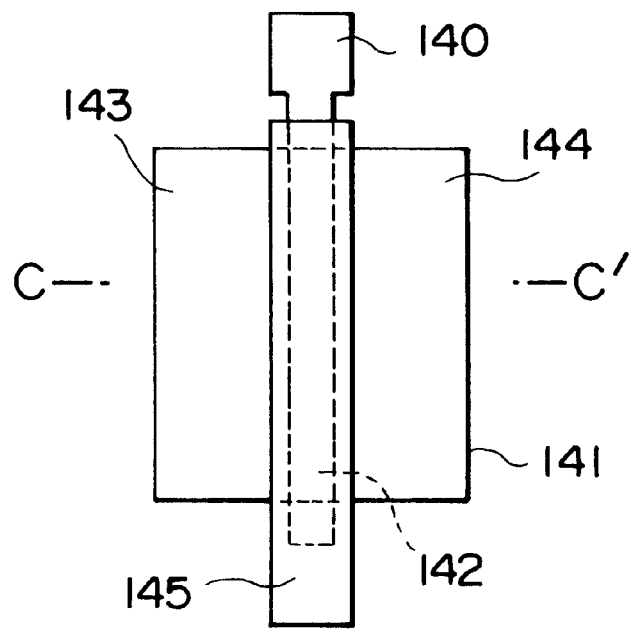
FIG. 14 is a plan view showing an N-channel MOSFET according to a fourth embodiment of this invention.
Figure 15:
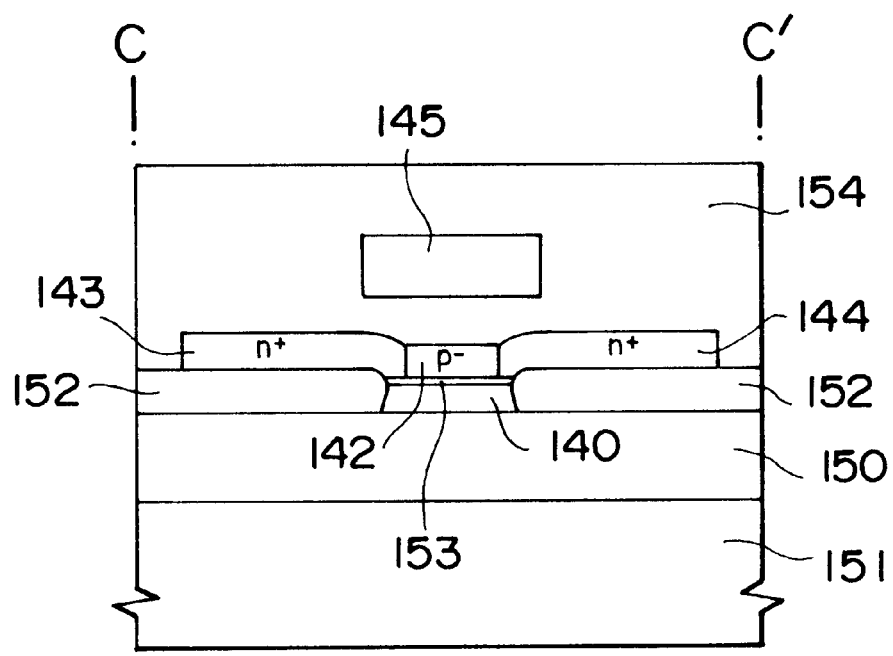
FIG. 15 is a cross sectional view showing the N-channel MOSFET illustrated in FIG. 14, taken along C-C' line.

The fourth embodiment in FIGS. 14 and 15 is similar to the first embodiment in FIGS. 7 and 8 except that a back gate is arranged in an insulating layer.

Specifically, as illustrated in FIG. 14, an N-channel MOSFET has a gate region 140 of a silicon layer, an active region 141 of a polysilicon. In this event, a channel region 142 and an n$^+$ source diffusion layer 143 and an n$^+$ drain diffusion layer 144 are formed in the active region 141.

As shown in FIG. 15, an oxide film 150 is embedded in a silicon substrate 151. The N-channel MOSFET illustrated in FIG. 14 is formed on the oxide film 150 over the silicon substrate 151. Specifically, the gate region 140 is formed on the oxide film 150. In this event, oxide layers 152 (namely, LOCOS layers) are formed at both sides of the gate region 140 on the oxide film 150 for electrical separation. Further, the active region 141 is formed over the gate region 140 via a gate oxide film 153. In this event, the channel region 142 is formed over the gate region 140. The channel region 142 is placed between the n$^+$ source diffusion layer 143 and the n$^+$ drain diffusion layer 144.

In this case, each of the n$^+$ source diffusion layer 143 and the n$^+$ drain diffusion layer 144 is formed by doping impurity ions by using a photoresist as a mask after patterning the active region 141.

Further, the N-channel MOSFET is covered with an insulating layer 154 as illustrated in FIG. 15. In this event, a back gate 145 (namely, a wiring layer) is arranged in the insulating layer 154 and over the channel region 142 as shown in FIGS. 14 and 15.

According to the fourth embodiment, the channel length of the MOS transistor can be shortened like the first embodiment. In addition, the back gate 145 can be formed without an increase of the manufacturing step.

Fifth Embodiment

Figure 16:
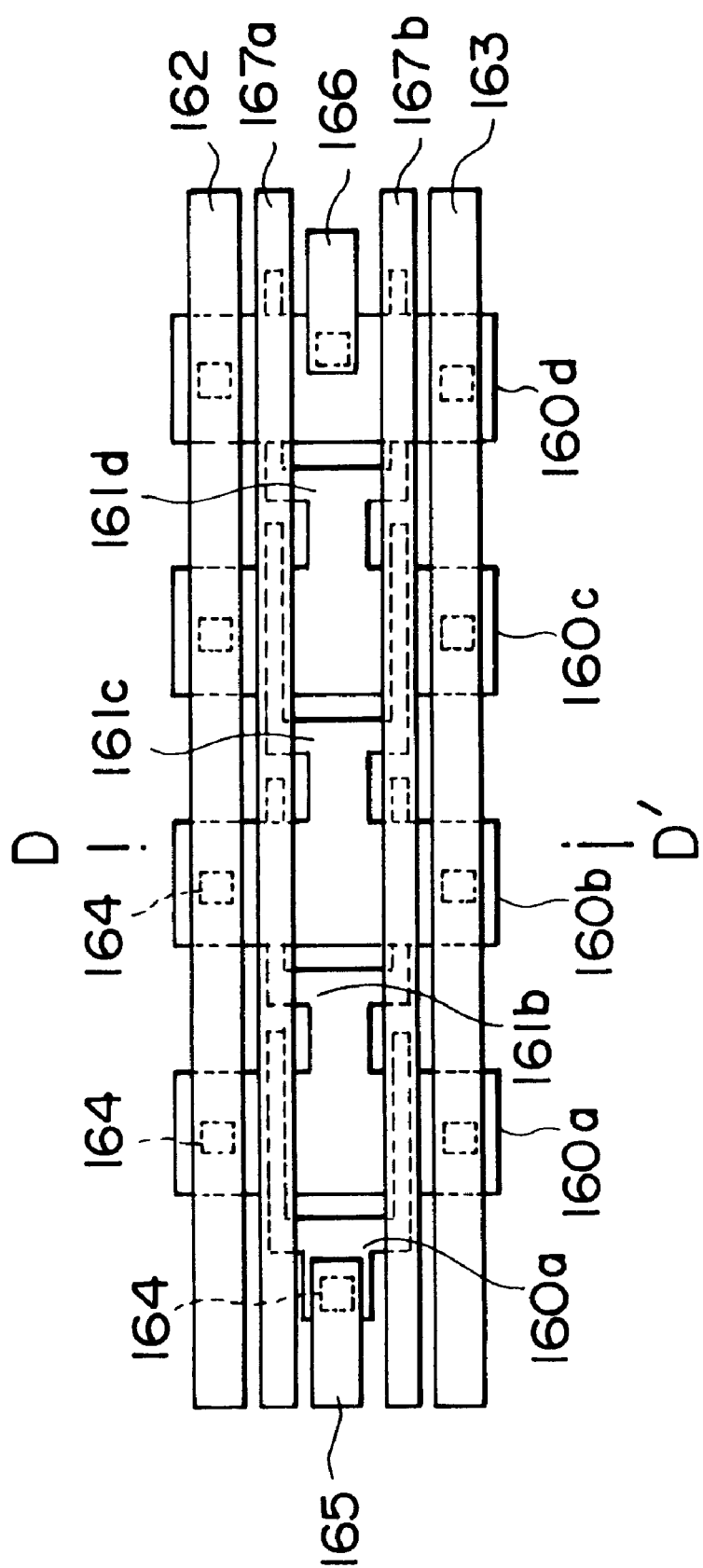
FIG. 16 is a plan view showing a layout of a delay circuit according to a fifth embodiment of this invention.

The fifth embodiment in FIGS. 16 thorough 18 is similar to the second embodiment in FIGS. 9 through 11 except that back gates are arranged on in an insulating layer.

Figure 18:
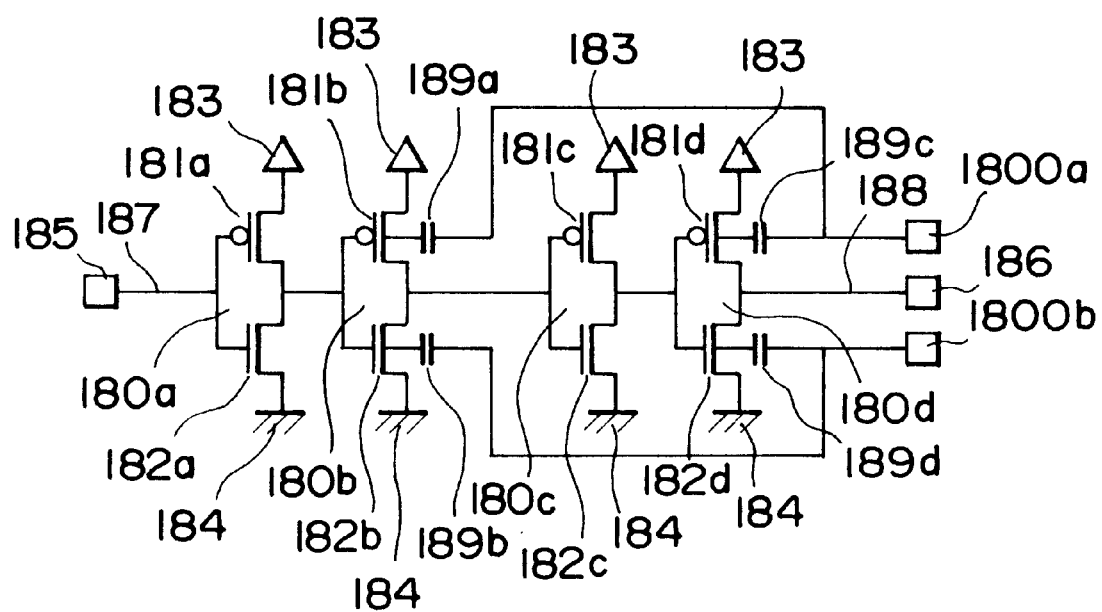
FIG. 18 is an equivalent circuit of the delay circuit illustrated in FIG. 16.

Specifically, a delay circuit illustrated in FIG. 18 is structured by connecting a first inverter 180a, a second inverter 180b, a third inverter 180c and a fourth inverter 180d in series. The first inverter 180a is composed of a P-channel MOSFET 181a and an N-channel MOSFET 182a while the second inverter 180b is composed of a P-channel MOSFET 181b and an N-channel MOSFET 182b. Further, the third inverter 180c is composed of a P-channel MOSFET 181c and an N-channel MOSFET 182c while the fourth inverter 180d is composed of a P-channel MOSFET 181d and an N-channel MOSFET 182d. In this event, the P-channel MOSFETs 181a through 181d are connected to a power supply 183 while the N-channel MOSFETs 182a through 182d are connected a ground 184. Further, the first inverter 180a is connected to an input terminal 185 via a signal line 187 while the fourth inverter 180d is connected to an output terminal 186 via a signal line 188. Moreover, capacitors 189a and 189b are connected to the P-channel MOSFET 181b and the N-channel MOSFET 182b, respectively. Further, capacitors 189c and 189d are connected to the P-channel MOSFET 181d and the N-channel MOSFET 182d, respectively. In this case, the capacitors 189c and 189d are connected to back gate terminals 1800a and 1800b, respectively.

Figure 17:
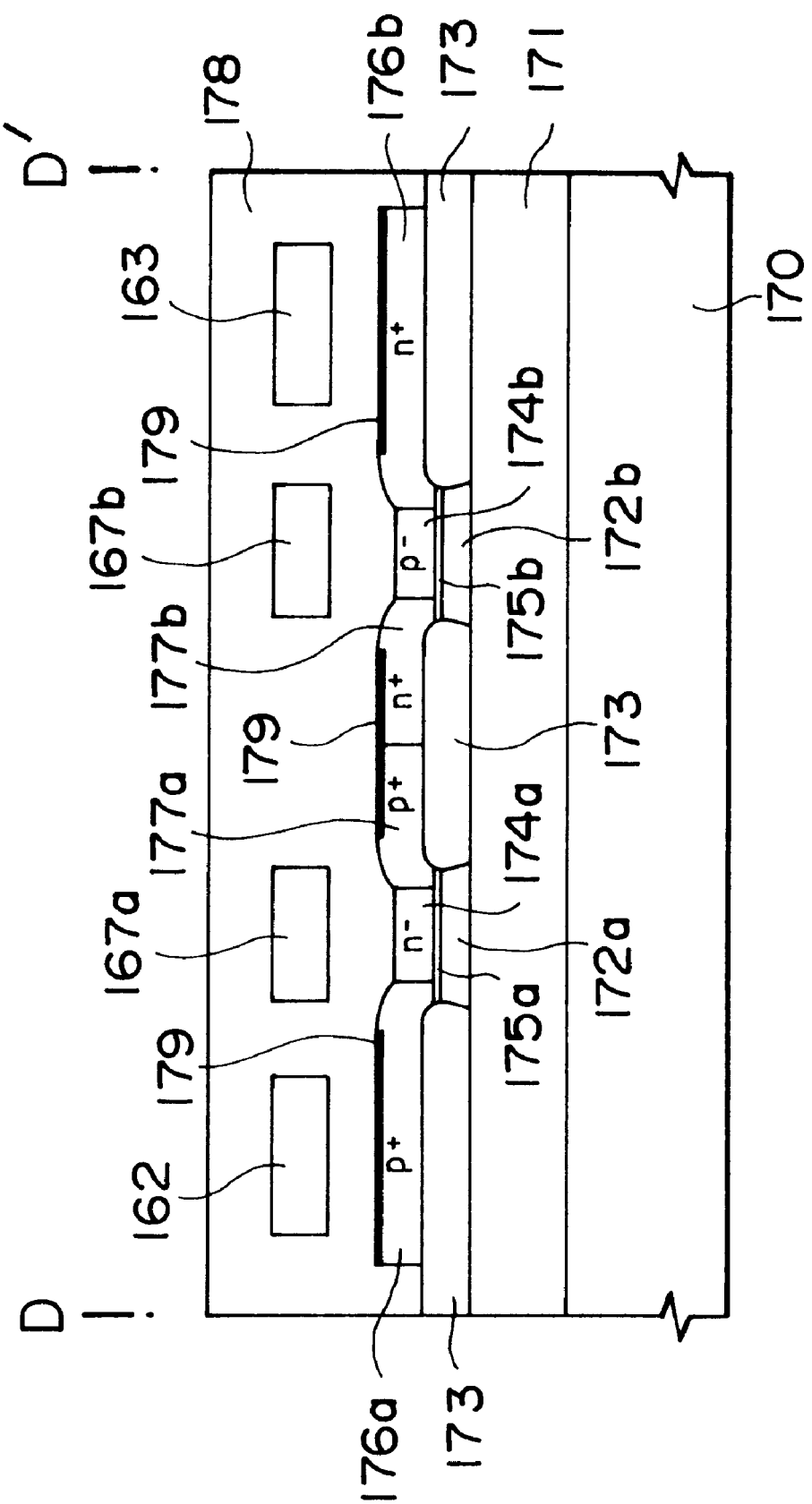
FIG. 17 is a cross sectional view showing the delay circuit illustrated in FIG. 16, taken along D-D' line.

Herein, it is to be noted that each of the first and third inverters 180a and 180c corresponds to the conventional inverter (without back gates)illustrated in FIG. 4 while each of the second and fourth inverters 180b and 180d corresponds to the inverter illustrated in FIG. 17 according to the fifth embodiment.

A layout of the delay circuit in FIG. 18 is shown in FIG. 16.

In the layout, gate region 161a and 161c are formed over active regions 160a and 160c while active regions 160b and 160d are formed over gate region 161b and 161d. A power supply wiring layer 162 and a ground wiring layer 163 are formed over the active regions 160a, 160b, 160c and 160d via contacts 164. Further, the gate region 161a is connected to a signal wiring layer 165 via the contact 94 while the active region 160d is connected to a signal wiring layer 166 via the contact 166. Herein, each of the active regions 160a and 160c is formed by a silicon layer while each of the gate region s 161a and 161c is formed by a polysilicon layer as illustrated in FIG. 4.

On the other hand, each of the active regions 160b and 160d is formed by the polysilicon layer while each of the gate regions 161b and 161d is formed by the silicon layer as illustrated in FIG. 17. In this event, the power supply wiring layer 162 and the ground wiring layer 163 correspond to the power supply 183 and the ground 184 in FIG. 18, respectively, while the signal wiring layers 165 and 166 correspond to the signal lines 187 and 188 in FIG. 18. Further, back gates 167a and 167b are arranged over the active regions 160a through 160d and over the gate regions 161a through 161d as shown in FIG. 16. In this event, the back gates 167a and 167b are connected to the back gate terminals 1800a and 1800b in FIG. 18, respectively.

In FIG. 17, the P-channel MOSFET 181b and the N-channel MOSFET 182b which constitutes the inverter 180b in FIG. 18 are formed over a silicon substrate 170. An oxide film 171 is embedded in the silicon substrate 170. Gate regions 172a and 172b are formed on the oxide film 171. In this event, the gate regions 171a and 172b correspond to the gate region 161b in FIG. 16. Further, oxide layers 173 (namely, LOCOS layers) are formed on the oxide film 171 for electrical separation. An n-channel region 174a is formed over the gate region 172a via a gate oxide film 175a. A p$^+$ source diffusion layer 176a and a p$^+$ drain diffusion layer 177a are placed at both sides of the n-channel region 174a. In this case, the p$^+$ source diffusion layer 176a, p$^+$ drain diffusion layer 177a and the n-channel region 174a are formed in the active region 160b illustrated in FIG. 16. As mentioned before, the gate region 172a is formed by the silicon layer while each of the p$^+$ source diffusion layer 176a, p$^+$ drain diffusion layer 177a and the n-channel region 174a is formed by the polysilicon layer. Thus, the P-channel MOSFET 111b illustrated in FIG. 16 is structured.

On the other hand, a p-channel region 174b i s formed over the gate region 172b with a gate oxide film 175b therebetween. An n$^+$ source diffusion layer 176b and n$^+$ drain diffusion layer 177b are placed at both sides of the p-channel region 174b. In this case, the n$^+$ source diffusion layer 176b, n$^+$ drain diffusion layer 177b and the p-channel region 174b are formed in the active region 160b illustrated in FIG. 16. As mentioned before, the gate region 172b is formed by the silicon layer while each of the n$^+$ source diffusion layer 176b, n$^+$ drain diffusion layer 177b and the p-channel region 174b is formed by the polysilicon layer. Thus, the N-channel MOSFET 182b illustrated in FIG. 18 is structured.

Moreover, the P-channel MOSFET 181b and the N-channel MOSFET 182b are covered with an insulating film 817. In this event, the power supply wiring layer 162, the ground wiring layer 163 and the back gates 167a and 167b in FIG. 16 are arranged in the insulating film 178.

With such a structure, a power supply potential is given to the p+ source diffusion layer 176a of the P-channel MOSFET 181b from the power supply wiring layer 162 via the contact 164. Further, a ground potential is given to the n+ source diffusion layer 176b of the N-channel MOSFET 182b from the ground wiring layer 163 via the contact 164. Moreover, silicide layers 179 are formed on the diffusion layers 176 and 177 to reduce sheet resistance. Further, the p+ drain diffusion layer 177a of the P-channel MOSFET 181a is connected to the n+ drain diffusion layer 177b of the N-channel MOSFET 182b by the silicide layer 179. Thus, the second inverter 180b in FIG. 18 is structured. Likewise, the fourth inverter 180d is formed in the same manner with the second inverter 180d as illustrated in FIG. 17.

As shown in FIG. 16, the drain diffusion layers (output terminal) in the active region 160a of the first inverter 180a is directly coupled or integrated with the gate region 161b (input terminal) of the second inverter 180b. In this event, the active region 160a and the gate region 161b are formed by the same silicon layer.

Further, the drain diffusion layers (output terminal) in the active region 160b of the second inverter 1180b is directly coupled or integrated with the gate region 161c (input terminal) of the third inverter 180c. In this event, the active region 160b and the gate region 161c are formed by the same polysilicon layer.

Moreover, the drain diffusion layers (output terminal) in the active region 160c of the third inverter 180c is directly coupled or integrated with the gate region 161d (input terminal) of the fourth inverter 180d. In this event , the active region 160c and the gate region 161d are formed by the same silicon layer.

In this case, no metal wiring layers are used to connect the drain diffusion layers with the gate regions 161. Consequently, the metal wiring area in the logic block is reduced to increase the integration degree the device.

According to the fifth embodiment, the SOI MOSFET of this invention and the conventional SOI MOSFET are formed on the same substrate. Consequently, the diffusion layer (output terminal) of the CMOS logic block can be connected to the gate region (input terminal) of the next stage of CMOS logic block without the metal wiring layer. Thereby, the metal wiring area in the logic block is reduced to increase the integration degree of the device.

Further, in the P-channel MOSFET, the potential of each channel region can be controlled via the capacitors 189a and 189c in FIG. 18 by controlling the potential of the back gate 167a. In the N-channel MOSFET, the potential of each channel region can be controlled via the capacitors 189b and 189d in FIG. 18 by controlling the potential of the back gate 167b in the same manner. Consequently, threshold values of the MOSFETs illustrated in FIG. 18 are changed by controlling the potential of the back gate. Thus, the delay value of the delay circuit in FIG. 18 can be controlled.

In addition, according to the fifth embodiment, the SOI MOSFET of this invention and the conventional SOI MOSFET are formed on the same substrate. Consequently, the back gate can be formed by the use of the normal metal wiring layer without an increase of the manufacturing process. Further, the circuit characteristic can be determined by controlling the potential of the back gate.

What is claimed is:

1. A semiconductor device with a MOS transistor over a silicon substrate, comprising:

a silicon substrate with a first insulator layer thereon;

an oxide layer on said first insulator layer and with an opening extending vertically therethrough;

a gate electrode in said opening and on said first insulator layer;

a gate oxide film on said gate electrode and within said opening;

a horizontally extended semiconductor layer containing source and drain regions that are on said oxide layer and a channel region that is between said source and drain regions and on said gate oxide film, said channel region having a horizontal width that is narrower than a corresponding width of said gate electrode so that said source and drain regions extend over respective edge portions of said gate electrode;

a second insulator layer that is on said semiconductor layer; and a back gate wiring layer that is within said second insulator layer and that is over said channel region, said back gate wiring layer having a potential different from a potential of said gate electrode when the semiconductor device is operating to control a potential of said channel region.

2. The device of claim 1, wherein said gate oxide layer has a first thickness and said back gate wiring layer is spaced from said channel region by a distance that is greater than said first thickness of said gate oxide film.

3. A semiconductor device with a MOS transistor over a silicon substrate, comprising:

a silicon substrate with a first insulator layer directly thereon;

an oxide layer that is directly on said first insulator layer and that has an opening therethrough that extends to said first insulator layer;

a gate electrode that is in said opening and directly on said first insulator layer;

a gate oxide film having a first thickness and that is directly on said gate electrode and entirely within said opening;

a semiconductor layer containing source and drain regions that are directly on said oxide layer and containing a channel region that is between said source and drain regions and directly on said gate oxide film and that is narrower than said gate electrode so that said source and drain regions are directly over and contact respective edge portions of said gate oxide film;

a second insulator layer that is on said semiconductor layer; and a back gate wiring layer that is within and surrounded by said second insulator layer and that is directly over said channel region, said back gate wiring layer being spaced from said channel region by a distance that is greater than said first thickness of said gate oxide film and having a potential different from a potential of the gate electrode when the semiconductor device is operating to control a potential of said channel region.

* * * * *